United States Patent [19]

Nishikawa et al.

[11] 4,275,606
[45] Jun. 30, 1981

[54] PUSHBUTTON TUNER

[75] Inventors: Yasuhisa Nishikawa; Ryoichi Hasumi, both of Toda, Japan

[73] Assignee: Clarion Co., Ltd., Tokyo, Japan

[21] Appl. No.: 58,665

[22] Filed: Jul. 18, 1979

[51] Int. Cl.³ ............................. H03J 1/06; H03J 5/12
[52] U.S. Cl. .................................. 74/10.39; 74/10.27; 74/10.37; 74/89.15; 403/3
[58] Field of Search ................. 74/10.27, 10.33, 10.37, 74/10.8, 89.15; 334/7; 403/3, 4

[56] References Cited

U.S. PATENT DOCUMENTS

| 3,602,051 | 8/1971 | Olah | 74/10.39 X |
|---|---|---|---|
| 4,144,511 | 3/1979 | Collings | 74/10.39 X |
| 4,183,250 | 1/1980 | Monath et al. | 74/10.33 |
| 4,194,403 | 3/1980 | Santoro | 74/10.33 |

Primary Examiner—Allan D. Herrmann

[57] ABSTRACT

A pushbutton tuner wherein a core slide for causing cores to move in-and-out of coils, respectively, has a rack formed at one end thereof and a fine tuning operating mechanism mounted on an auxiliary mechanism baseplate has a pinion meshable with the rack, which tuner is characterized in that the core slide has, at another end thereof, an extended portion formed with another rack symmetrical with the aforesaid rack so as to allow the fine tuning operating mechanism to be mounted on either end of the core slide.

2 Claims, 1 Drawing Figure

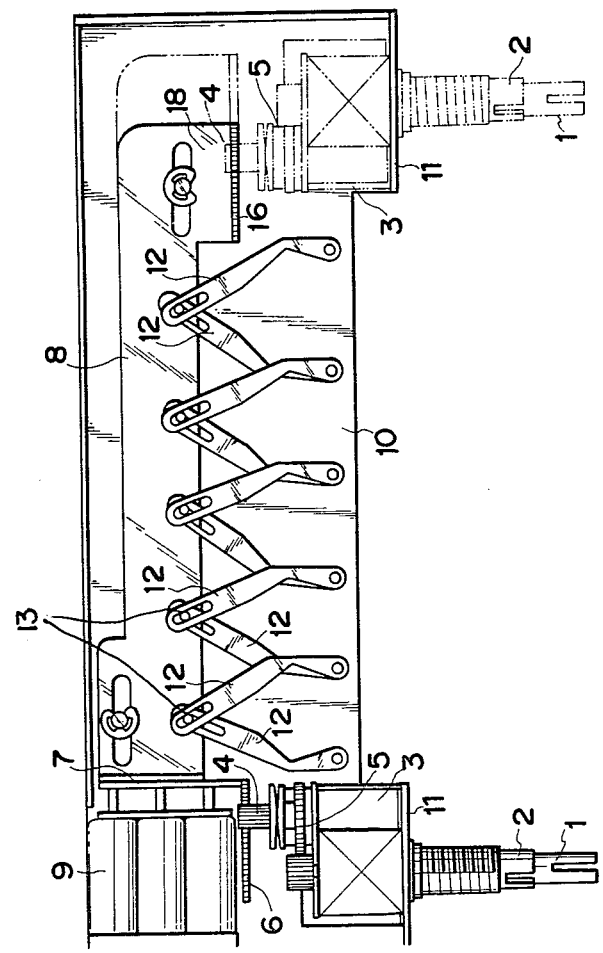

PUSHBUTTON TUNER

TECHNICAL FIELD

This invention relates to a pushbutton tuner and more particularly to a structure for mounting a fine tuning operating mechanism in the pushbutton tuner.

BACKGROUND ART

In general, a pushbutton tuner is required to have a rotary fine tuning mechanism operable by manual handling as well as a tuning mechanism operable by push buttons. As known, this fine tuning mechanism is mounted on left or right side of the pushbutton tuner housing depending upon the position in a car where the mechanism is mounted. However, the design of the pushbutton tuner such as arrangement of a circuit board for the fine tuning mechanism and other components should be greatly changed depending upon which side the mechanism is mounted on. Accordingly, a manufacturing line for the pushbutton tuners should be changed depending upon the types of the pushbutton tuners as mentioned above and the manufacturing line adapted for either one of the types of the pushbutton tuner cannot be used for another type of pushbutton tuner. Thus, the manufacturing line is selected according to a manufacturing schedule of desired type of pushbutton tuners.

SUMMARY OF THE INVENTION

It is therefore an object of the present invention to provide a pushbutton tuner with a fine tuning operating mechanism easily adaptable according to the position in a car where it is mounted.

In accordance with the invention, there is provided a pushbutton tuner comprising a plurality of tuning coils; cores adapted to be put into or drawn out from said tuning coils, respectively; a core slide for causing said cores to move relative to said coils; and fine tuning operating means; said core slide has at opposite ends thereof portions for engaging with said fine tuning operating means.

BRIEF DESCRIPTION OF THE DRAWING

The FIGURE is a schematic plan view of main components of a pushbutton tuner in accordance with the present invention.

DETAILED DESCRIPTION OF THE INVENTION

A baseplate 10 has seats 11 formed on opposite sides thereof. Intermediate of the baseplate 10 is an area for mounting a plurality of button slides for carrying out so-called one-touch selection operation. At this area, a plurality of pairs of actuating links 12 crossed each other are also mounted. The rear end portion of each of the actuating links 12 is engaged with a pin 13 on a core slide 8. The core slide 8 is displaced to the left or to the right when one of pins provided on frequency regulating members on the button slides is actuated through engagement with the converging edges of the actuating links. A core seat 7 is provided at a position adjacent to one end of the core slide 8 for moving cores in-and-out of coils 9. The core seat 7 has a rack 6 engageable with a pinion 4 formed at a forward portion of an operation mechanism 5 for rotary fine tuning. The operation mechanism 5 is comprised of a train of gears and other components integrally assembled with an auxiliary mechanism baseplate 3 and a rotary operation shaft 1 and a rotary operation shaft sleeve 2 which are projected forwardly from a seat 11 formed on a baseplate. Another end of the core slide 8 has an extended portion 18 extended towards another seat 11. The extended portion 18 has an auxiliary rack 16 formed thereon symmetrically with the rack 6.

In accordance with this embodiment, when the fine tuning operation mechanism 5 is mounted on the left side of the pushbutton tuner as illustrated in a solid line in the FIGURE, it is apparent that smooth operation can be attained in the pushbutton tuner with the fine tuning operation mechanism mounted on the left side. On the other hand, when a fine tuning operation mechanism 5 is required to be mounted on the right side, the fine tuning operation mechanism 5 integrally assembled with an auxiliary mechanism baseplate 3 is mounted on the seat 11 as illustrated in a phantom line and a pinion 4 is meshed with the auxiliary rack 16.

Thus, it is possible for the present embodiment to adapt for either type of pushbutton tuner simply by placing the operation mechanism on the left or right side of the tuner. No change in design of coils, cores, a circuit board, a slide member, etc. is required any more. Accordingly, either type of pushbutton tuner can be manufactured according to a single manufacturing line.

We claim:

1. A pushbutton tuner comprising a plurality of tuning coils; cores adapted to be put into or drawn out from said tuning coils, respectively; a core slide for causing said cores to move relative to said coils; and fine tuning operating means; said core slide has at opposite ends thereof portions for engaging with said fine tuning operating means.

2. A pushbutton tuner as set forth in claim 1, wherein said fine tuning operating means has a pinion, the engaging portions of said core slide are each comprised of a rack formed on one end of said core slide and a rack provided on an extended portion formed on another end of said core slide, and either of said racks is adapted to be meshed with said pinion.

* * * * *